United States Patent
Daigo et al.

(10) Patent No.: US 10,501,849 B2
(45) Date of Patent: Dec. 10, 2019

(54) FILM FORMING APPARATUS AND FILM FORMING METHOD

(71) Applicant: NuFlare Technology, Inc., Kanagawa (JP)

(72) Inventors: Yoshiaki Daigo, Kanagawa (JP); Kiyotaka Miyano, Tokyo (JP)

(73) Assignee: NuFlare Technology, Inc., Kanagawa (JP)

(*) Notice: Subject to any disclaimer, the term of this patent is extended or adjusted under 35 U.S.C. 154(b) by 0 days.

(21) Appl. No.: 15/797,008

(22) Filed: Oct. 30, 2017

(65) Prior Publication Data
US 2018/0119280 A1 May 3, 2018

(30) Foreign Application Priority Data
Oct. 31, 2016 (JP) .................... 2016-213499

(51) Int. Cl.
*C23C 16/455* (2006.01)
*C23C 16/18* (2006.01)
(Continued)

(52) U.S. Cl.
CPC ........ *C23C 16/45565* (2013.01); *C23C 16/18* (2013.01); *C23C 16/4408* (2013.01);
(Continued)

(58) Field of Classification Search
CPC ........ C23C 16/45565; C23C 16/45557; C23C 16/4412; C23C 16/45561;
(Continued)

(56) References Cited

U.S. PATENT DOCUMENTS

2015/0371875 A1* 12/2015 Sasaki ............... H01L 21/67028
  15/316.1
2016/0102401 A1* 4/2016 Takahashi ............. C23C 16/303
  438/478
(Continued)

FOREIGN PATENT DOCUMENTS

JP 2002-129337 5/2002
JP 2008-277762 11/2008
(Continued)

*Primary Examiner* — Selim U Ahmed
*Assistant Examiner* — Evan G Clinton
(74) *Attorney, Agent, or Firm* — Rankin, Hill & Clark LLP

(57) ABSTRACT

The film forming apparatus includes a reaction chamber in which a substrate subjected to film forming processing can be placed, a gas supplier provided in an upper part of the reaction chamber, having a portion where gas is introduced and gas supply holes to face the substrate, a source-gas introducing line introducing a source gas into the gas supplier, a replacement-gas introducing line introducing a replacement gas into the gas supplier, a discharge line discharging the replacement gas along with a remaining source gas which is the source gas remaining in the gas supplier from the gas supplier; and a controller controlling one of an introduction amount of the replacement gas and a discharge amount of the remaining source gas and the replacement gas to be an amount corresponding to the other amount.

13 Claims, 4 Drawing Sheets

(51) Int. Cl.
  *C23C 16/52* (2006.01)
  *C23C 16/44* (2006.01)
  *C30B 25/14* (2006.01)
  *C30B 25/16* (2006.01)
  *C30B 29/40* (2006.01)
  *C30B 29/68* (2006.01)
  *H01L 21/02* (2006.01)
  *H01L 33/06* (2010.01)
  *H01L 33/00* (2010.01)

(52) U.S. Cl.
  CPC .... *C23C 16/4412* (2013.01); *C23C 16/45523* (2013.01); *C23C 16/45561* (2013.01); *C23C 16/45578* (2013.01); *C23C 16/52* (2013.01); *C30B 25/14* (2013.01); *C30B 25/165* (2013.01); *C30B 29/403* (2013.01); *C30B 29/68* (2013.01); *H01L 21/0254* (2013.01); *H01L 21/0262* (2013.01); *H01L 33/005* (2013.01); *H01L 33/06* (2013.01)

(58) Field of Classification Search
  CPC .......... C23C 16/45523; C23C 16/4408; C23C 16/45578; C23C 16/52; C30B 25/14; C30B 25/165
  See application file for complete search history.

(56) References Cited

U.S. PATENT DOCUMENTS

2016/0376699 A1\* 12/2016 Sasaki ............... H01J 37/32449
                                                            118/697
2017/0198391 A1\*  7/2017 Ashihara ............. C23C 16/4412

FOREIGN PATENT DOCUMENTS

| JP | 2009-130108 | 6/2009 |
| JP | 2013-102200 | 5/2013 |
| WO | 2004/007797 | 1/2004 |

\* cited by examiner

FILM FORMING APPARATUS AND FILM FORMING METHOD

CROSS-REFERENCE TO RELATED APPLICATIONS

This application is based upon and claims the benefit of priority from Japanese Patent Application No. 2016-213499, filed on Oct. 31, 2016, the entire contents of which are incorporated herein by reference.

FIELD

The embodiments of the present invention relate to a film forming apparatus and a film forming method.

BACKGROUND

In order to form films using a MOCVD method (a metalorganic chemical vapor deposition method), a showerhead-type MOCVD apparatus is conventionally used. In the showerhead-type MOCVD apparatus, a source gas introduced into a showerhead through an introducing line is supplied into a chamber through a shower plate to grow epitaxial films on a wafer in the chamber.

The MOCVD method is used, for example, when a stacked film having a superlattice structure such as an LED (Light Emitting Diode) or a HEMT (High Electron Mobility Transistor) is to be formed. For example, when a superlattice such as AlN/GaN layers is to be formed, films of respective layers need to be formed without source gases corresponding to the films being mixed with each other to provide steepness in a composition change at interfaces between the films of the respective layers.

SUMMARY

However, because the conductance of the shower plate is generally small, the source gas of a lower layer film may remain in the showerhead even if the source gas of the lower layer film is discharged from the introducing line via a vent line after the lower layer film is formed and then the source gas is to be changed to form an upper layer film. If the source gas of the lower layer film remains in the showerhead, the remaining source gas of the lower layer film mixes with the source gas of the upper layer film newly introduced into the showerhead and consequently it becomes difficult to provide the steepness in the composition change.

In order to prevent mixture of the source gases in the showerhead, film formation is conventionally interrupted for a long time at the time of switching the source gases, where introduction of the source gas of the upper layer film into the showerhead is waited until the source gas of the lower layer film is completely discharged from the showerhead.

However, because the number of stacked layers is large, for example, 80 to 100 particularly in the HEMT, there is a problem that the throughput is greatly reduced due to the film formation interruption for a long time at the formation of each layer.

An object of the present invention is to provide a film forming apparatus and a film forming method that can suppress reduction of the throughput when a superlattice having steep composition changes is to be formed.

A film forming apparatus according to an aspect of the present invention comprises:
a reaction chamber in which a substrate subjected to film forming processing can be placed;
a gas supplier provided in an upper part of the reaction chamber, having a portion where gas is introduced and gas supply holes to face the substrate;
a source-gas introducing line introducing a source gas into the gas supplier;
a replacement-gas introducing line introducing a replacement gas into the gas supplier;
a discharge line discharging the replacement gas along with a remaining source gas which is the source gas remaining in the gas supplier from the gas supplier; and
a controller controlling one of an introduction amount of the replacement gas and a discharge amount of the remaining source gas and the replacement gas to be an amount corresponding to the other amount.

In the film forming apparatus described above, the replacement-gas introducing line may be a line independent of the source-gas introducing line.

In the film forming apparatus described above, the replacement-gas introducing line may comprise a bypass line communicated with the source-gas introducing line and may have a replacement gas introduced thereinto, and
the replacement gas may be introduced from the bypass line into the reaction chamber through the source-gas introducing line.

In the film forming apparatus described above, the controller may control the introduction amount of the replacement gas and the discharge amount of the remaining source gas and the replacement gas to be an equal flow rate.

In the film forming apparatus described above, the controller may comprise
a first mass flow controller controlling the introduction amount of the replacement gas, and
a second mass flow controller controlling the discharge amount of the remaining source gas and the replacement gas, and
the first mass flow controller and the second mass flow controller may control flow rates of gases flowing therethrough, respectively, to be an equal flow rate.

In the film forming apparatus described above, the source-gas introducing line may comprise
a group-III run line introducing a group-III source gas into the gas supplier, and
a group-V run line introducing a group-V source gas into the gas supplier.

A film forming method according to another aspect of the present invention comprises:
placing a substrate in a reaction chamber;
introducing a first source gas containing a component of a first film into a gas supplier facing the substrate and having gas supply holes provided thereon through a source-gas introducing line communicated with the gas supplier, and supplying the first source gas into the reaction chamber from the gas supplier through the gas supply holes, to form the first film on the substrate;
stopping introduction of the first source gas; and
introducing a replacement gas into the gas supplier, discharging the replacement gas along with a first remaining source gas which is the first source gas remaining in the gas supplier from the gas supplier through a discharge line communicated with the gas supplier, and controlling one of an introduction amount of the replacement gas and a discharge amount of the first remaining source gas and the replacement gas to be an amount corresponding to the other amount.

In the film forming method described above, it is possible to configure that the method further comprises discharging the replacement gas along with the first remaining source gas, then introducing a second source gas containing a component of a second film into the gas supplier through the source-gas introducing line, and supplying the second source gas from the gas supplier into the reaction chamber through the gas supply holes, to form the second film on the first film.

In the film forming method described above, the first source gas may contain a group-III source gas and a group-V source gas.

In the film forming method described above, the second source gas may contain a group-III source gas and a group-V source gas.

According to the present invention, it is possible to increase the throughput when a superlattice having steep composition changes is to be formed.

DETAILED DESCRIPTION

Embodiments of the present invention will now be explained with reference to the accompanying drawings. The present invention is not limited to the embodiments. In FIGS. 1 to 4, constituent elements which are not always necessary for explaining the embodiments according to the present invention will be omitted to avoid complication of the drawings.

First Embodiment

Figure 1:
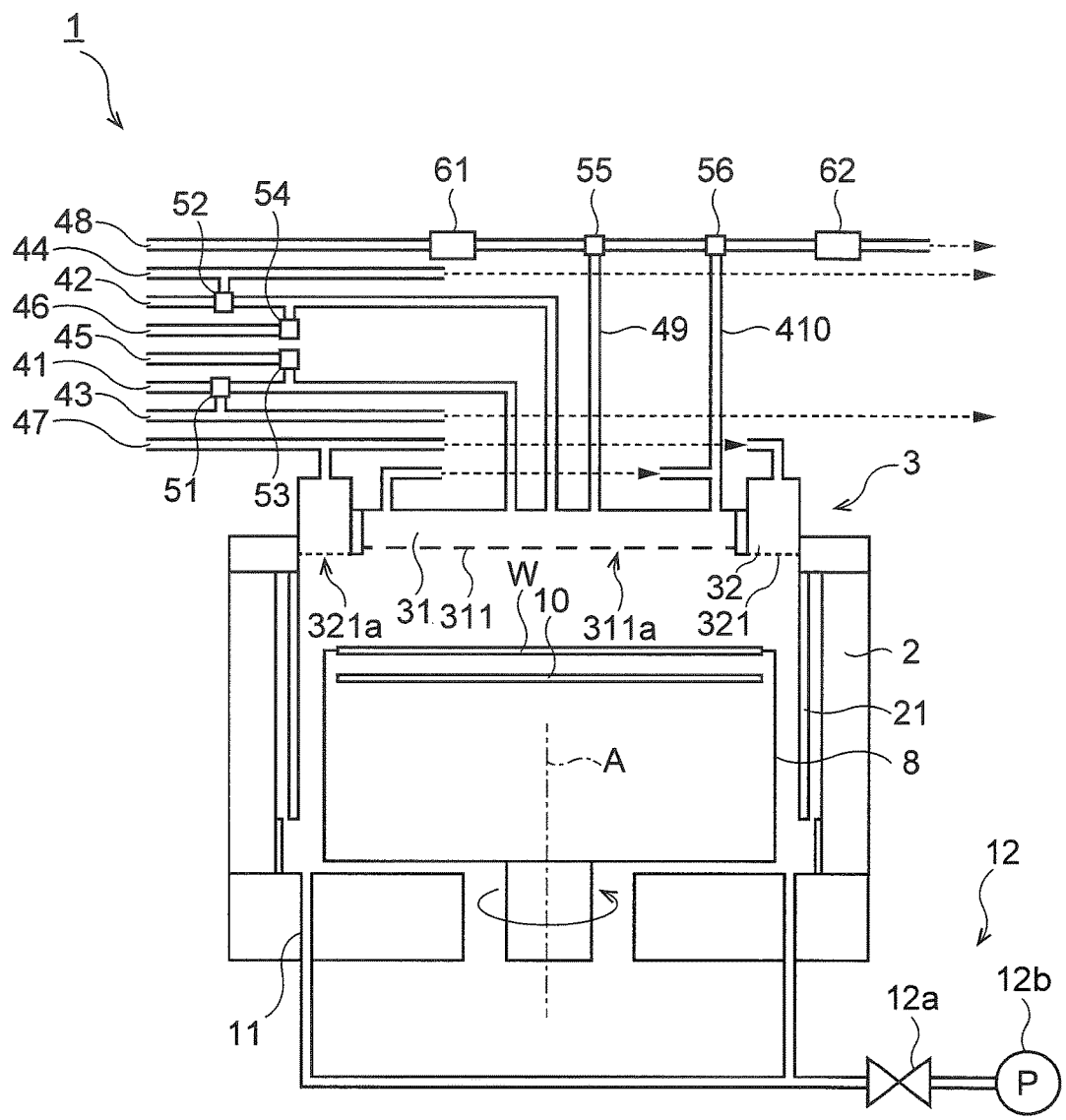
FIG. 1 is a sectional view illustrating an example of a vapor-phase growth apparatus according to a first embodiment.

FIG. 1 is a sectional view of a vapor-phase growth apparatus 1 being an example of a film forming apparatus according to the present embodiment. The vapor-phase growth apparatus 1 in FIG. 1 is a single-wafer-type epitaxial growth apparatus that forms a stacked film including first films and second films stacked alternately as an example of a superlattice having steep composition changes on a wafer W being an example of a substrate by using the MOCVD method. In the following explanations, an example where the first films and the second films are both group III-V semiconductor layers is described.

As illustrated in FIG. 1, the vapor-phase growth apparatus 1 includes a chamber 2 being an example of a reaction chamber, and a showerhead 3 being an example of a gas supplier. The showerhead 3 includes an inner showerhead 31, and an outer showerhead 32 that surrounds the inner showerhead 31. The inner showerhead 31 and the outer showerhead 32 have portions where gases are introduced (i.e. inner spaces).

The vapor-phase growth apparatus 1 also includes a group-III run line 41 and a group-V run line 42, which are examples of a source-gas introducing line, a group-III vent line 43, and a group-V vent line 44. The vapor-phase growth apparatus 1 further includes a group-III bypass line 45, a group-V bypass line 46, and a liner purge line 47. The vapor-phase growth apparatus 1 includes a replacement gas line 48, a replacement-gas introducing line 49, and a showerhead vent line 410 being an example of a discharge line. In the present embodiment, the replacement-gas introducing line 49 is an introducing line independent of the group-III run line 41 and the group-V run line 42 (the source-gas introducing lines).

The vapor-phase growth apparatus 1 also includes a valve (hereinafter, also "group-III valve") 51 provided on the group-III run line 41, a valve (hereinafter also "group-V valve") 52 provided on the group-V run line 42, a valve (hereinafter, also "group-III compensation valve") 53 provided on the group-III bypass line 45, a valve (hereinafter, also "group-V compensation valve") 54 provided on the group-V bypass line 46, and an upstream valve 55 and a downstream valve 56 provided on the replacement gas line 48.

The vapor-phase growth apparatus 1 further includes a mass flow controller 61 that controls the supply amount of a replacement gas, and a mass flow controller 62 that controls the discharge amount of a vent gas from the inner showerhead 31 as examples of a controller. The vapor-phase growth apparatus 1 also includes a rotating part 8, a heater 10, a gas discharge part 11, and a discharge mechanism 12.

The group-III run line 41 is connected to the inner showerhead 31 so as to be communicated with the inner portion of the inner showerhead 31.

At the time of supplying source gases for the first film of the stacked film, the group-III run line 41 introduces a group-III source gas (hereinafter, also "group-III source gas for the first film") being an example of a first source gas that contains a component of the first film into the inner showerhead 31. The group-III source gas for the first film introduced into the inner showerhead 31 is supplied into the chamber 2 via an inner shower plate 311. The first film is, for example, an AlN layer. The group-III source gas for the first film is, for example, a trimethylaluminum gas (hereinafter, also "TMA gas"). The TMA gas can be generated, for example, by bubbling, that is, vaporizing liquid trimethylaluminum using a carrier gas such as hydrogen. Because the group-III source gas for the first film is transported in a state mixed with the carrier gas, it is hereinafter assumed that the group-III source gas for the first film contains the carrier gas.

At the time of supplying source gases for the second film of the stacked film, the group-III run line 41 introduces a group-III source gas (hereinafter, also "group-III source gas for the second film") being an example of a second source gas that contains a component of the second film into the inner showerhead 31. The group-III source gas for the second film introduced into the inner showerhead 31 is supplied into the chamber 2 via the inner shower plate 311. The second film is, for example, a GaN layer. When the first film is the AlN layer and the second film is the GaN layer, the stacked film is AlN/GaN layers. The group-III source gas for the second film is, for example, a trimethylgallium gas (hereinafter, also "TMG gas"). The TMG gas can be generated, for example, by bubbling liquid trimethylgallium using a carrier gas such as hydrogen. Because the group-III source gas for the second film is transported in a state mixed with the carrier gas, it is hereinafter assumed that the group-III source gas for the second film contains the carrier gas.

The group-V run line 42 is connected to the inner showerhead 31 so as to be communicated with the inner portion of the inner showerhead 31. At the time of supplying the source gases for the first film and the second film, the group-V run line 42 introduces a group-V source gas into the inner showerhead 31. The group-V source gas introduced into the inner showerhead 31 is supplied into the chamber 2 via the inner shower plate 311. The group-V source gases for the first film and the second film can be the same or different. The group-V source gas for forming the AlN/GaN layers is, for example, an ammonia gas. The group-V source gas is sometimes transported in a state mixed with the carrier gas and, in this case, it is assumed the group-V source gas contains the carrier gas.

The group-III vent line 43 is connected to the group-III run line 41 via the valve 51 provided on the group-III run line 41. A group-III vent gas flows through the group-III vent line 43. For example, a hydrogen ($H_2$) gas, a nitrogen ($N_2$) gas, or an argon (Ar) gas can be used as the group-III vent gas.

After one of the first film and the second film is formed and before formation of the other film is started, supply of the source gas for the formed film is stopped to switch to supply of the source gas for the other film. At the time of stopping the source gas to switch the source gases, the group-III vent line 43 is communicated with the group-III run line 41 via the valve 51.

When the group-III vent line 43 is communicated with the group-III run line 41, the group-III source gas is introduced into the group-III vent line 43 from the group-III run line 41. The group-III vent line 43 discharges the group-III source gas introduced from the group-III run line 41 along with the group-III vent gas flowing through the group-III vent line 43.

The group-V vent line 44 is connected to the group-V run line 42 via the group-V valve 52 provided on the group-V run line 42. A group-V vent gas flows through the group-V vent line 44. The group-V vent gas can be, for example, a hydrogen gas, a nitrogen gas, or an argon gas. At the time of stopping the source gases, the group-V vent line 44 is communicated with the group-V run line 42 via the group-V valve 52. When the group-V vent line 44 is communicated with the group-V run line 42, the group-V source gas is introduced into the group-V vent line 44 from the group-V run line 42. The group-V vent line 44 discharges the group-V source gas introduced from the group-V run line 42 along with the group-V vent gas flowing through the group-V vent line 44.

The group-III bypass line 45 is connected to the group-III run line 41 via the valve 53 provided on the group-III bypass line 45. At the time of stopping the source gases, the group-III bypass line 45 is communicated with the group-III run line 41 via the valve 53. When communicated with the group-III run line 41, the group-III bypass line 45 introduces a group-III compensation gas into the group-III run line 41. The group-III compensation gas is a gas supplied into the inner showerhead 31 to suppress a pressure change in the inner showerhead 31 due to stop of the group-III source gas.

A pressure change in the inner showerhead 31 leads to a pressure change in the chamber 2, which may cause a failure such as displacement or breakage of the wafer W placed in the chamber 2, or adhesion of particles to the wafer W. In order to prevent such a failure, suppression of a pressure change in the inner showerhead 31 is required.

The group-III compensation gas can be, for example, a hydrogen gas, a nitrogen gas, or an argon gas. It is desirable that an introduction amount of the group-III compensation gas into the group-III run line 41 is equal to a discharge amount of the group-III source gas from the group-III run line 41 to the group-III vent line 43 in order to effectively suppress a pressure change in the inner showerhead 31.

The group-V bypass line 46 is connected to the group-V run line 42 via the valve 54 provided on the group-V bypass line 46. At the time of stopping the source gases, the group-V bypass line 46 is communicated with the group-V run line 42 via the valve 54. When communicated with the group-V run line 42, the group-V bypass line 46 introduces a group-V compensation gas into the group-V run line 42. The group-V compensation gas is a gas supplied into the inner showerhead 31 in order to suppress a pressure change in the inner showerhead 31 due to stop of the group-V source gas. The group-V compensation gas can be, for example, a hydrogen gas, a nitrogen gas, or an argon gas. In order to effectively suppress a pressure change in the inner showerhead 31, it is desirable that an introduction amount of the group-V compensation gas into the group-V run line 42 is equal to a discharge amount of the group-V source gas from the group-V run line 42 to the group-V vent line 44.

The liner purge line 47 is connected to the outer showerhead 32 so as to be communicated with the inner portion of the outer showerhead 32. A liner purge gas introduced from the liner purge line 47 into the outer showerhead 32 is introduced into the chamber 2 via an outer shower plate 321, passes through between a sidewall of a liner 21 that prevents adhesion of depositions onto a wall surface of the chamber 2 and the rotating part 8, and is discharged to the gas discharge part 11. The liner purge gas can be, for example, a hydrogen gas, a nitrogen gas, or an argon gas.

A replacement gas for discharging the source gases in the inner showerhead 31 flows through the replacement gas line 48. The replacement gas can be, for example, a hydrogen gas, a nitrogen gas, or an argon gas.

An upstream end of the replacement-gas introducing line 49 is connected to the replacement gas line 48 via the valve 55 provided on the replacement gas line 48. A downstream end of the replacement-gas introducing line 49 is connected to the inner showerhead 31 so as to be communicated with the inner portion of the inner showerhead 31. At the time of stopping the source gases, the replacement-gas introducing line 49 is communicated with the replacement gas line 48 via the valve 55. Due to communication with the replacement gas line 48, the replacement-gas introducing line 49 introduces the replacement gas into the inner showerhead 31.

An upstream end of the showerhead vent line 410 is connected to the inner showerhead 31 so as to be communicated with the inner portion of the inner showerhead 31. As illustrated in FIG. 1, the upstream end of the showerhead vent line 410 can branch into a plurality of portions to be connected to the inner showerhead 31. Branching of the upstream end of the showerhead vent line 410 into the portions to be connected to the inner showerhead 31 enables the gases in the inner showerhead 31 to be effectively discharged. A downstream end of the showerhead vent line 410 is connected to the replacement gas line 48 via the valve 56 provided on the replacement gas line 48 downstream of the valve 55. At the time of stopping the source gases, the showerhead vent line 410 discharges the replacement gas along with the source gases (hereinafter, also "residual source gas") remaining in the inner showerhead 31 from the inner showerhead 31. The residual source gas and the replacement gas discharged from the inner showerhead 31 are introduced into the replacement gas line 48 and are discharged along with the replacement gas flowing through the replacement gas line 48.

The mass flow controller 61 is provided on the replacement gas line 48 upstream of the valve 55. The mass flow controller 61 controls the flow rate of the replacement gas flowing through the replacement gas line 48 upstream of the replacement-gas introducing line 49. In this manner, the mass flow controller 61 controls the introduction amount of the replacement gas to be introduced into the inner showerhead 31 via the replacement-gas introducing line 49.

The mass flow controller 62 is provided on the replacement gas line 48 downstream of the valve 56. The mass flow controller 62 controls the flow rate of the residual source gas and the replacement gas flowing through the replacement gas line 48 downstream of the showerhead vent line 410. In this manner, the mass flow controller 62 controls the discharge amount of the residual source gas and the replacement gas to be discharged from the inner showerhead 31 through the showerhead vent line 410.

In introducing the replacement gas and discharging the residual source gas and the replacement gas into or from the inner showerhead 31, the vapor-phase growth apparatus 1 controls one of the introduction amount and the discharge amount to be an amount corresponding to the other amount. For example, the mass flow controllers 61 and 62 control the flow rates of the gases flowing therethrough to be the same flow rate, to control the introduction amount and the discharge amount with respect to the inner showerhead 31 to be the same amount. Accordingly, the residual source gas can be discharged through the showerhead vent line 410 and a pressure change in the inner showerhead 31 can be suppressed. Due to suppression of a pressure change in the inner showerhead 31, a pressure change in the chamber 2 can be easily suppressed without depending on control of the discharge gas amount from the chamber 2.

The inner showerhead 31 is provided in an upper portion of the chamber 2. The inner showerhead 31 has the inner shower plate 311 on the bottom surface side. A plurality of inner gas supply holes 311a are provided on the inner shower plate 311. The outer showerhead 32 is provided to surround the inner shower plate 311 in the upper portion of the chamber 2. The outer showerhead 32 has the outer shower plate 321 on the bottom surface side. A plurality of outer gas supply holes 321a are provided on the outer shower plate 321. The inner shower plate 311 and the outer shower plate 321 can be formed of a metallic material such as stainless steel or aluminum alloy.

At the time of supplying the source gases for the first film, the group-III source gas for the first film is introduced into the inner showerhead 31 from the group-III run line 41 and the group-V source gas is introduced therein from the group-V run line 42. The introduced group-III source gas and group-V source gas for the first film are mixed in the inner showerhead 31 and then supplied into the chamber 2 through the inner gas supply holes 311a of the inner shower plate 311.

At the time of supplying the source gases for the second film, the group-III source gas for the second film is introduced into the inner showerhead 31 from the group-III run line 41 and the group-V source gas is introduced therein from the group-V run line 42. The introduced group-III source gas and group-V source gas for the second film are mixed in the inner showerhead 31 and then supplied into the chamber 2 through the inner gas supply holes 311a.

On the other hand, at the time of stopping the source gases, the group-III compensation gas is introduced into the inner showerhead 31 from the group-III run line 41 and the group-V compensation gas is introduced therein from the group-V run line 42. The introduced group-III compensation gas and group-V compensation gas pass through the inner gas supply holes 311a of the inner shower plate 311 to be supplied into the chamber 2.

At the time of stopping the source gases, the replacement gas is further introduced into the inner showerhead 31 from the replacement gas line 48 through the replacement-gas introducing line 49. The introduced replacement gas is discharged from the inner showerhead 31 through the showerhead vent line 410 along with the residual source gas in the inner showerhead 31. The gas discharged from the inner showerhead 31 can contain the group-III compensation gas and the group-V compensation gas. A part of the introduced replacement gas and the residual source gas in the inner showerhead 31 can be supplied into the chamber 2 through the inner gas supply holes 311a of the inner shower plate 311.

The rotating part 8 has a mounting part (not illustrated) on which the wafer W is mounted at an upper portion thereof and supports the wafer W horizontally. The mount part (not illustrated) has, for example, a ring shape and supports a peripheral portion of the wafer W.

The rotating part 8 rotates on a vertical rotation axis A while holding the wafer W in the chamber 2. The rotation axis A can pass through the center of the wafer W. With rotation of the rotating part 8, the wafer W held on the rotating part 8 rotates on the rotation axis A. The rotating part 8 is rotationally driven with drive force of a drive source (not illustrated), such as a motor.

The heater 10 heats the wafer W. A specific heating method of the heater 10 is not particularly limited and can be, for example, resistance heating or lamp heating.

The gas discharge part 11 discharges redundant source gases or reaction by-products from the inner portion of the chamber 2 to outside.

The discharge mechanism 12 controls the inner portion of the chamber 2 to have a desired pressure via the gas discharge part 11 by operations of a discharge valve 12a and a vacuum pump 12b.

(Film Forming Method)

Figure 2:
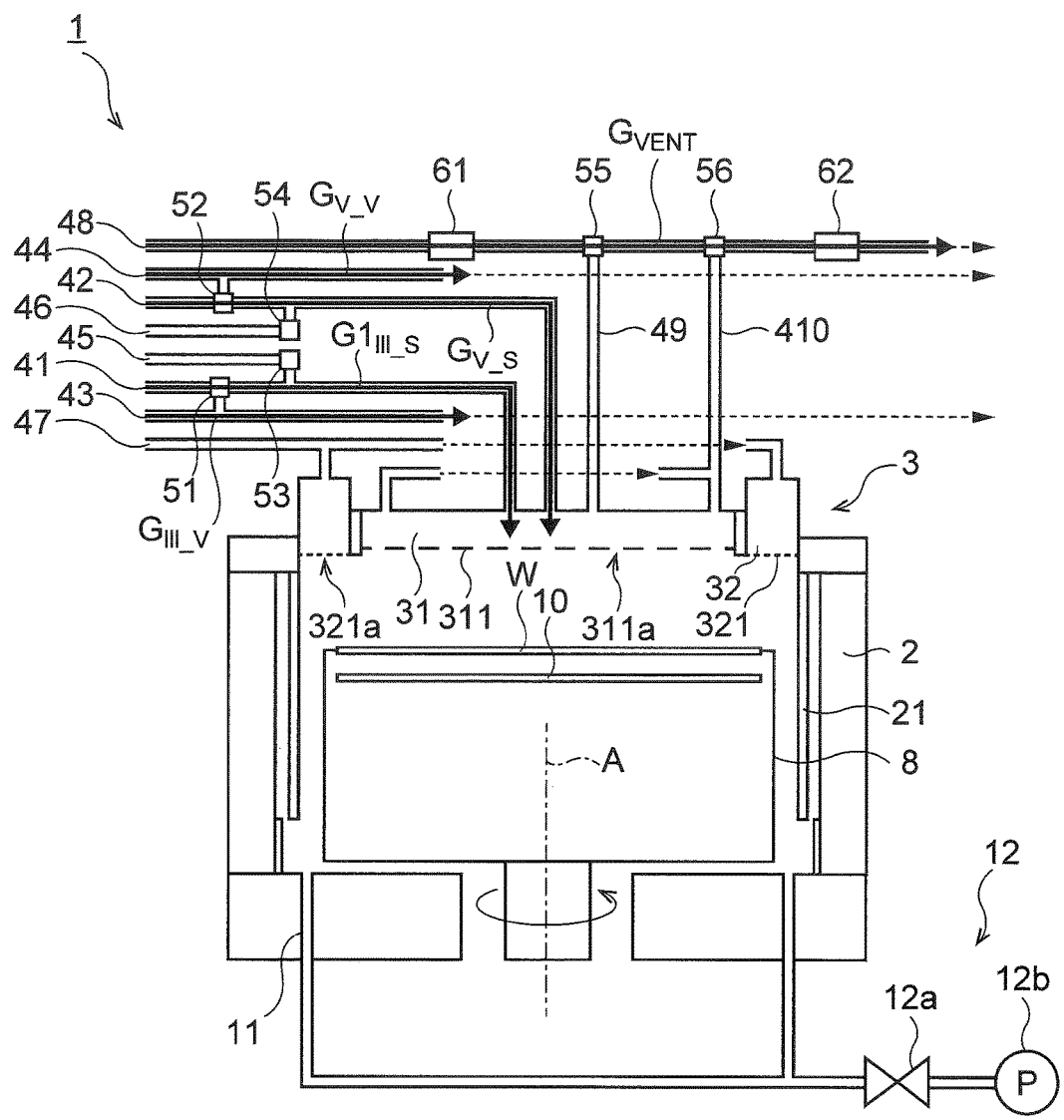
FIG. 2 is an explanatory diagram for explaining flows of gases at the time of supplying source gases in a film forming method according to the first embodiment.

A film forming method, that is, a vapor-phase growth method according to the first embodiment using the vapor-phase growth apparatus 1 configured as described above is explained next below. In the film forming method explained below, a stacked film of group III-V semiconductor layers is formed by the MOCVD method. FIG. 2 is an explanatory diagram for explaining flows of gases at the time of supplying the source gases in the film forming method according to the first embodiment.

First, the wafer W is mounted by a robot arm (not illustrated) on the mount part (not illustrated) provided at the upper portion of the rotating part 8 in the chamber 2. After the wafer W is mounted on the mount part (not illustrated) provided at the upper portion of the rotating part 8, the discharge mechanism 12 discharges gases in the chamber 2 via the gas discharge part 11 to adjust the pressure in the chamber 2 to a desired pressure. The heater 10 heats the wafer W to an epitaxial growth temperature.

Next, equal flow rates are set to the upstream mass flow controller 61 and the downstream mass flow controller 62 as flow rates of gases to be controlled at the time of stopping the source gases, respectively. The flow rates of the mass flow controllers 61 and 62 can be set by an input operation of a user or can be automatically set by a controller (not illustrated) of the vapor-phase growth apparatus 1 in accordance with a preset recipe.

The rotating part 8 rotates the wafer W on the rotation axis A. While the wafer W is rotated, the group-III source gas and the group-V source gas for the first film are first supplied onto the wafer W as the source gases for the first film.

At the time of supplying the source gases for the first film, the valve 51 opens the group-III run line 41 to the inner showerhead 31 and closes the group-III run line 41 to the group-III vent line 43. This causes the group-III run line 41 and the inner showerhead 31 to be communicated with each other and a group-III source gas $G1_{III\_S}$ for the first film is introduced into the inner showerhead 31 through the group-III run line 41 as illustrated in FIG. 2.

At the time of supplying the source gases for the first film, the group-V valve 52 opens the group-V run line 42 to the inner showerhead 31 and closes the group-V run line 42 to the group-V vent line 44. Accordingly, the group-V run line 42 and the inner showerhead 31 are communicated with each other and a group-V source gas $G_{V\_S}$ is introduced into the inner showerhead 31 through the group-V run line 42 as illustrated in FIG. 2.

Meanwhile, at the time of supplying the source gases for the first film, the group-III compensation valve 53 closes the group-III bypass line 45 to inhibit introduction of a group-III compensation gas $G_{III\_C}$ (see FIG. 3) to the group-III run line 41. The group-V compensation valve 54 closes the group-V bypass line 46 to inhibit introduction of a group-V compensation gas $G_{V\_C}$ (see FIG. 3) to the group-V run line 42.

At the time of supplying the source gases for the first film, the valve 55 closes the replacement gas line 48 upstream of the valve 55 to the replacement-gas introducing line 49 and opens the upstream replacement gas line 48 to the replacement gas line 48 downstream of the valve 55. The valve 56 opens the replacement gas line 48 downstream of the valve 56 to the replacement gas line 48 upstream of the valve 56 and closes the downstream replacement gas line 48 to the showerhead vent line 410. Accordingly, introduction of a replacement gas $G_{VENT}$ to the inner showerhead 31 is inhibited at the time of supplying the source gases for the first film.

The group-III source gas $G1_{III\_S}$ and the group-V source gas $G_{V\_S}$ for the first film introduced into the inner showerhead 31 are mixed in the inner showerhead 31 and then are supplied onto the wafer W through the inner gas supply holes 311a. The group-III source gas $G1_{III\_S}$ and the group-V source gas $G_{V\_S}$ for the first film supplied from the inner gas supply holes 311a react on the wafer W. In this manner, the first film is epitaxially grown on the wafer W.

Figure 3:
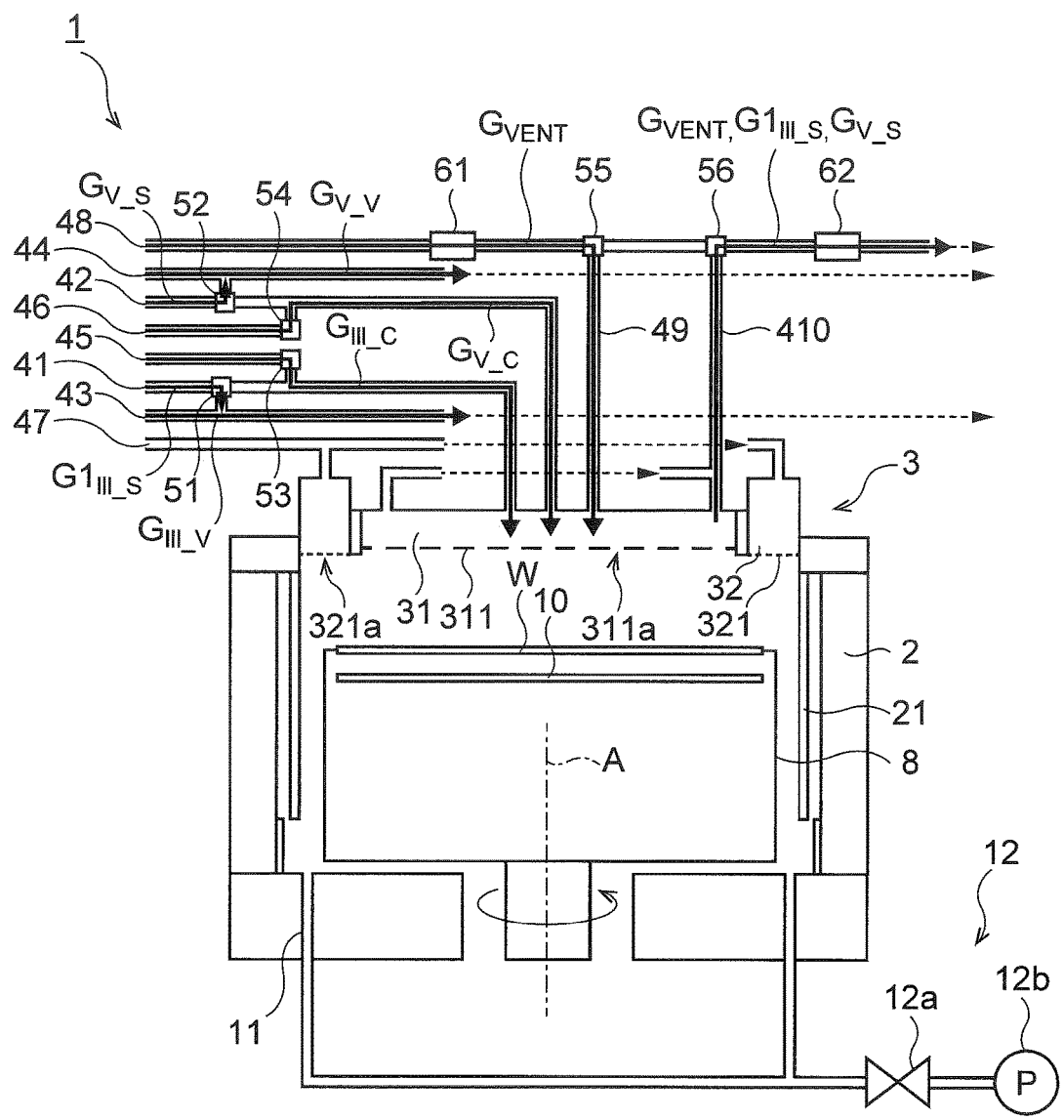
FIG. 3 is an explanatory diagram for explaining flows of gases at the time of stopping source gases in the film forming method according to the first embodiment.

FIG. 3 is an explanatory diagram for explaining flows of gases at the time of stopping the source gases in the film forming method according to the first embodiment. After the first film is formed, supply of the group-III source gas $G1_{III\_S}$ and the group-V source gas $G_{V\_S}$ for the first film to the inner showerhead 31 is stopped.

At the time of stopping the source gases for the first film, the group-III valve 51 closes the group-III run line 41 to the inner showerhead 31 and opens the group-III run line 41 to the group-III vent line 43. This causes the group-III run line 41 and the group-III vent line 43 to be communicated with each other and the group-III source gas $G1_{III\_S}$ for the first film is discharged from the group-III run line 41 through the group-III vent line 43 as illustrated in FIG. 3. More specifically, the group-III vent line 43 discharges the group-III source gas $G1_{III\_S}$ for the first film introduced from the group-III run line 41 along with a group-III vent gas $G_{III\_V}$ flowing through the group-III vent line 43. Due to discharge of the group-III source gas $G1_{III\_S}$ for the first film from the group-III run line 41, introduction of the group-III source gas $G1_{III\_S}$ for the first film into the inner showerhead 31 is stopped.

At the time of stopping the source gases for the first film, the group-V valve 52 closes the group-V run line 42 to the inner showerhead 31 and opens the group-V run line 42 to the group-V vent line 44. Accordingly, the group-V run line 42 and the group-V vent line 44 are communicated with each other and the group-V source gas $G_{V\_S}$ is discharged from the group-V run line 42 through the group-V vent line 44 as illustrated in FIG. 3. More specifically, the group-V vent line 44 discharges the group-V source gas $G_{V\_S}$ introduced from the group-V run line 42 along with a group-V vent gas $G_{V\_V}$ flowing through the group-V vent line 44. Due to discharge of the group-V source gas $G_{V\_S}$ from the group-V run line 42, introduction of the group-V source gas $G_{V\_S}$ into the inner showerhead 31 is stopped.

Meanwhile, at the time of stopping the source gases for the first film, the group-III compensation valve 53 opens the group-III bypass line 45. Accordingly, the group-III bypass line 45 and the group-III run line 41 are communicated with each other and the group-III compensation gas $G_{III\_C}$ is introduced into the inner showerhead 31 through the group-III bypass line 45 and the group-III run line 41 as illustrated in FIG. 3. At this time, it is desirable that a mass flow controller (not illustrated) provided on the group-III bypass line 45 performs adjustment to introduce the same amount of the group-III compensation gas $G_{III\_C}$ as the discharge amount of the group-III source gas $G1_{III\_S}$ for the first film to the group-III vent line 43. Matching the introduction amount of the group-III compensation gas $G_{III\_C}$ and the discharge amount of the group-III source gas $G1_{III\_S}$ for the first film can suppress a pressure change in the showerhead 3.

The group-III compensation gas $G_{III\_C}$ introduced into the inner showerhead 31 passes through the inner gas supply holes 311a of the inner shower plate 311 to be supplied into the chamber 2. The group-III compensation gas $G_{III\_C}$ can be discharged from the inner showerhead 31 through the showerhead vent line 410 along with the replacement gas $G_{VENT}$.

At the time of stopping the source gases for the first film, the group-V compensation valve 54 opens the group-V bypass line 46. This causes the group-V bypass line 46 and the group-V run line 42 to be communicated with each other and the group-V compensation gas $G_{V\_C}$ is introduced into the inner showerhead 31 through the group-V bypass line 46 and the group-V run line 42 as illustrated in FIG. 3. At this time, it is desirable that a mass flow controller (not illustrated) provided on the group-V bypass line 46 performs adjustment to introduce the same amount of the group-V compensation gas $G_{V\_C}$ as the discharge amount of the group-V source gas $G_{V\_S}$ to the group-V vent line 44. Matching the discharge amount of the group-V source gas $G_{V\_S}$ and the introduction amount of the group-V compensation gas $G_{V\_C}$ can further suppress a pressure change in the showerhead 3.

The group-V compensation gas $G_{V\_C}$ introduced into the inner showerhead 31 passes through the inner gas supply holes 311a of the inner shower plate 311 to be supplied into the chamber 2. The group-V compensation gas $G_{V\_C}$ can be discharged from the inner showerhead 31 along with the replacement gas $G_{VENT}$ through the showerhead vent line 410.

At the time of stopping the source gases for the first film, the valve 55 opens the replacement gas line 48 upstream of the valve 55 to the replacement-gas introducing line 49 and closes the upstream replacement gas line 48 to the replacement gas line 48 downstream of the valve 55. Accordingly, the replacement gas line 48 and the replacement-gas introducing line 49 are communicated with each other and the replacement gas $G_{VENT}$ is introduced into the inner showerhead 31 through the replacement-gas introducing line 49 as illustrated in FIG. 3.

At the time of stopping the source gases for the first film, the valve 56 closes the replacement gas line 48 downstream of the valve 56 to the replacement gas line 48 upstream of the valve 56 and opens the downstream replacement gas line 48 to the showerhead vent line 410. Accordingly, the showerhead vent line 410 and the replacement gas line 48 are communicated with each other and the replacement gas $G_{VENT}$ introduced into the inner showerhead 31 is discharged from the inner showerhead 31 along with the residual source gases $G1_{III\_S}$ and $G_{V\_S}$ for the first film (i.e. a first remaining source gas) through the showerhead vent line 410 as illustrated in FIG. 3.

At this time, the mass flow controllers 61 and 62 control the respective flow rates thereof to be equal to each other. That is, the introduction amount of the replacement gas $G_{VENT}$ introduced into the inner showerhead 31 through the replacement-gas introducing line 49 matches the discharge amount of the replacement gas $G_{VENT}$ and the residual source gases $G1_{III\_S}$ and $G_{V\_S}$ discharged from the inner showerhead 31 through the showerhead vent line 410.

This enables the residual source gases $G1_{III\_S}$ and $G_{V\_S}$ for the first film to be discharged promptly from the showerhead 3 while suppressing a pressure change in the showerhead 3 easily and reliably.

After the replacement gas $G_{VENT}$ is discharged along with the residual source gases $G1_{III\_S}$ and $G_{V\_S}$ for the first film, the second film is formed on the first film. An operation of the vapor-phase growth apparatus 1 during formation of the second film is identical to that during formation of the first film except for using a group-III source gas for the second film instead of the group-III source gas $G1_{III\_S}$ for the first film.

That is, the group-III source gas for the second film is introduced into the inner showerhead 31 through the group-III run line 41, and the group-V source gas is introduced into the inner showerhead 31 through the group-V run line 42. At this time, due to the discharge through the showerhead vent line 410 described above, the residual source gases $G1_{III\_S}$ and $G_{V\_S}$ for the first film hardly remains in the inner showerhead 31. Therefore, the source gases for the second film can be introduced promptly into the inner showerhead 31 without requiring film formation interruption for a long time as in a conventional technique. The group-III source gas and the group-V source gas for the second film introduced into the inner showerhead 31 pass through the inner gas supply holes 311a of the inner shower plate 311 to be supplied onto the wafer W in the chamber 2. The supplied group-III source gas and group-V source gas for the second film react on the wafer W. In this manner, the second film is epitaxially grown on the first film.

When the film formation of the first film and the second film is to be further repeated alternately on the second film, the discharge operation (see FIG. 3) for the residual source gases is performed each time a new film is formed, and a subsequent film is formed thereafter.

When AlN/GaN layers are to be formed as a stacked film, the group-V source gas at the time of film formation of an AlN layer and the group-V source gas at the time of film formation of a GaN layer are both ammonia. In this case, supply of ammonia does not need to be stopped between film formation of an AlN layer and film formation of a GaN layer. Due to continuous supply of ammonia, etching of the AlN layer and the GaN layer can be suppressed by nitrogen produced by a pyrolysis of ammonia.

The film forming method of the first embodiment can be applied to film formation of various group III-V semiconductor stacked films having a superlattice structure in which the composition changes are steep, such as AlGaN/GaN layers, as well as to the AlN/GaN layers. The film forming method of the first embodiment can also be applied to film formation of semiconductor stacked films other than the group III-V semiconductor stacked film, such as a group II-VI semiconductor stacked film.

As described above, according to the first embodiment, the source gases remaining in the inner showerhead 31 can be discharged promptly through the showerhead vent line 410. Therefore, film formation of a next film can be started promptly. This enables quick formation of a superlattice having steep composition changes.

Furthermore, according to the first embodiment, in the introduction of the replacement gas $G_{VENT}$ into the inner showerhead 31 and the discharge of the residual source gases $G1_{III\_S}$ and $G_{V\_S}$ and the replacement gas $G_{VENT}$ from the inner showerhead 31, one of the introduction amount and the discharge amount can be controlled to be an amount corresponding to the other amount. Accordingly, a pressure change in the inner showerhead 31 can be suppressed. Because the suppression of the pressure change can be completed in the inner showerhead 31, a pressure change in the chamber 2 associated with switching between the source gases can be suppressed without depending on the discharge amount from the chamber 2.

Second Embodiment

A second embodiment in which a compensation gas is substituted for the replacement gas $G_{VENT}$ is explained next. In the second embodiment, constituent elements corresponding to those of the first embodiment are denoted by like reference characters and redundant explanations thereof will be omitted.

Figure 4:
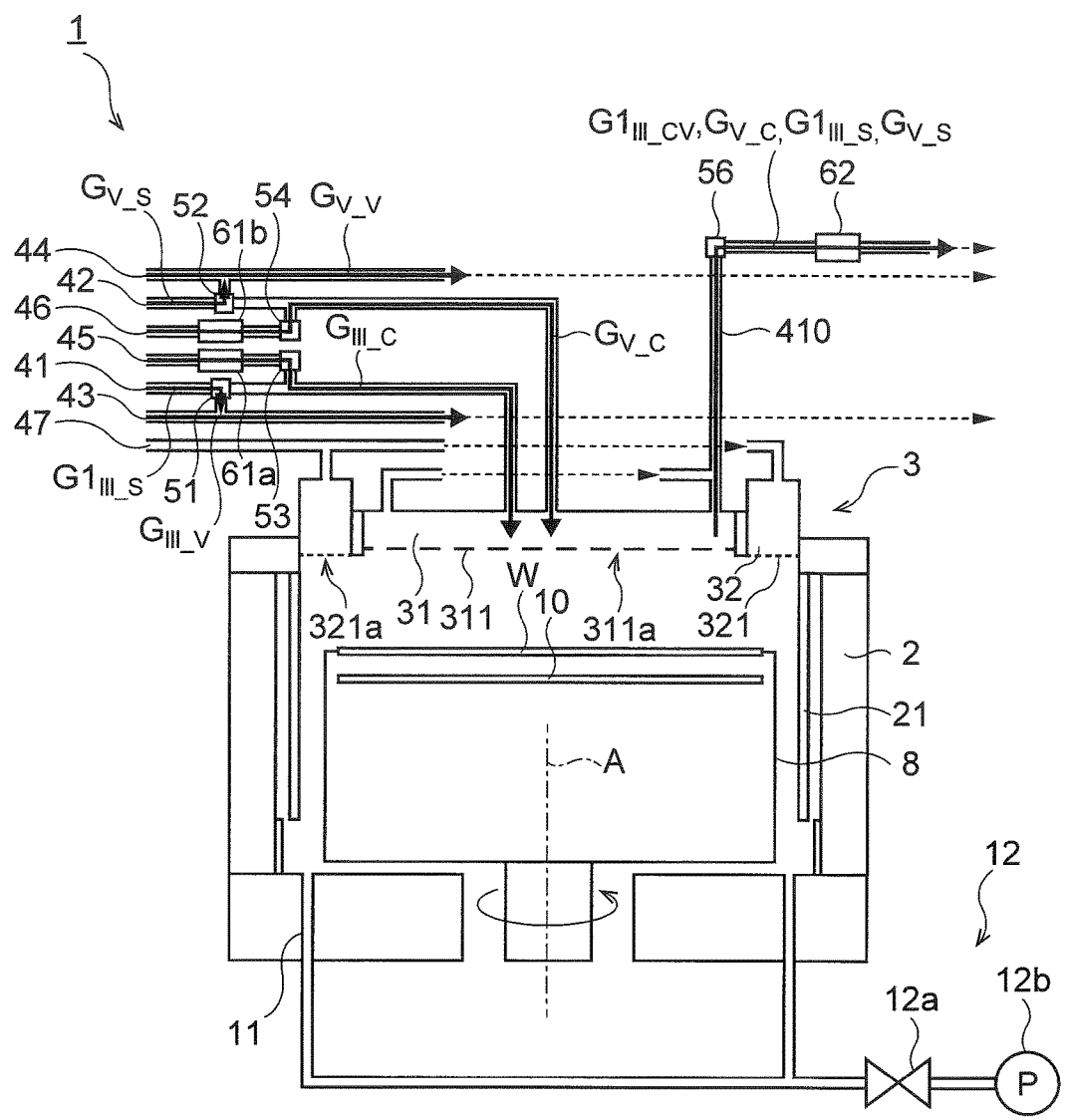
FIG. 4 is an explanatory diagram for explaining flows of gases at the time of stopping source gases in a film forming method according to a second embodiment.

FIG. 4 is an explanatory diagram for explaining flows of gases at the time of stopping the source gases in a film forming method of the second embodiment. As illustrated in FIG. 4, the vapor-phase growth apparatus 1 applicable to the film forming method of the second embodiment does not include the replacement gas line 48 and the replacement-gas introducing line 49.

Differently from the first embodiment, the second embodiment uses the group-III compensation gas $G_{III\_C}$ and the group-V compensation gas $G_{V\_C}$ as replacement gases, instead of introducing a replacement gas using an independent line, at the time of stopping the source gases.

Specifically, at the time of stopping the source gases, the source gases are discharged through the group-III vent line 43 and the group-V vent line 44 communicated with the group-III run line 41 and the group-V run line 42, and the compensation gases $G_{III\_C}$ and $G_{V\_C}$ are introduced into the inner showerhead 31 from the group-III bypass line 45 and the group-V bypass line 46 via the group-III run line 41 and the group-V run line 42, respectively. That is, introduction of the compensation gases $G_{III\_C}$ and $G_{V\_C}$ into the inner showerhead 31 is performed through the group-III run line 41 and the group-V run line 42, respectively.

A mass flow controller 61a is provided on the group-III bypass line 45 and a mass flow controller 61b is provided on the group-V bypass line 46. Due to the mass flow controllers 61a and 61b, the compensation gases $G_{III\_C}$ and $G_{V\_C}$ respectively having controlled flow rates are introduced into the inner showerhead 31 and a part of the residual source gases and the compensation gases $G_{III\_C}$ and $G_{V\_C}$ is discharged from the inner showerhead 31 through the showerhead vent line 410.

At this time, one of the introduction amount of the compensation gases $G_{III\_C}$ and $G_{V\_C}$ into the inner showerhead 31 and the discharge amount of the compensation gases $G_{III\_C}$ and $G_{V\_C}$ and the residual source gases from the inner showerhead 31 through the showerhead vent line 410 is controlled to be an amount corresponding to the other amount.

The introduction amount and the discharge amount can be controlled, for example, by the mass flow controllers 61a and 61b provided on the bypass lines 45 and 46 and the mass flow controller 62. The flow rate of the mass flow controller 62 is not particularly limited. However, it is desirable that the flow rate of the mass flow controller 62 is large because the efficiency in the discharge of the residual source gases in the inner showerhead 31 correspondingly becomes high. Typically, the flow rate of the mass flow controller 62 is about 0.1 to 10 times as large as the flow rate of the source gases discharged from the group-III run line 41 and the group-V run line 42 to the group-III vent line 43 and the group-V vent line 44, respectively. The introduction amount of the compensation gases $G_{III\_C}$ and $G_{V\_C}$ into the inner showerhead 31 can be set to a flow rate obtained by adding the flow rate set in the second mass flow controller 62 described above to a flow rate equivalent to that of the source gases discharged from the group-III run line 41 and the group-V run line 42 to the group-III vent line 43 and the group-V vent line 44.

According to the second embodiment, because the replacement gas line 48 can be omitted, a superlattice with steep composition changes can be formed promptly and at a low cost while a pressure change in the inner showerhead 31 is suppressed.

The embodiments described above have been presented by way of example only and are not intended to limit the scope of the invention. The embodiments can be implemented in a variety of other forms, and various omissions, substitutions and changes can be made without departing from the spirit of the invention. The embodiments and modifications thereof are included in the scope of invention described in the claims and their equivalents as well as the scope and the spirit of the invention.

In the above embodiments, a premix showerhead in which the group-III source gas and the group-V source gas are mixed in the inner showerhead 31 is used as an example. However, a separated-supply showerhead in which the group-III source gas and the group-V source gas can be separately supplied into the chamber 2 can be alternatively used.

A method of forming a superlattice structure directly on the wafer W is explained in the above embodiments. However, a superlattice structure can be formed after a foundation layer such as a buffer layer is formed.

Furthermore, in the above embodiments, a forming process of a superlattice structure is mainly explained. However, the embodiments can be used for formation of other epitaxial films formed on a superlattice structure.

The invention claimed is:

1. A film forming apparatus comprising:
   a reaction chamber in which a substrate subjected to film forming processing can be placed;
   a gas supplier provided in an upper part of the reaction chamber, having a portion where gas is introduced and gas supply holes to face the substrate;
   a source-gas introducing line introducing a source gas into the gas supplier, the source-gas introducing line comprising a valve;
   a vent line through which a vent gas flows, the vent line being connected to the source-gas introducing line via the valve;
   a replacement-gas introducing line introducing a replacement gas into the gas supplier;
   a discharge line discharging the replacement gas along with a remaining source gas which is the source gas remaining in the gas supplier from the gas supplier; and
   a mass flow controller controlling one of an introduction flow rate of the replacement gas and a discharge flow rate of the remaining source gas and the replacement gas to be a flow rate corresponding to the other flow rate,
   wherein the valve is capable of allowing the vent line to discharge the source gas from the source-gas introducing line along with the vent gas,
   the valve is interchangeable between a first state and a second state,
   the valve in the first state opens a connection between the source-gas introducing line and the gas supplier and closes a connection between the source-gas introducing line and the vent line, and
   the valve in the second state closes the connection between the source-gas introducing line and the gas supplier and opens the connection between the source-gas introducing line and the vent line to discharge the source gas from the source-gas introducing line along with the vent gas through the vent line.

2. The apparatus of claim 1, wherein the replacement-gas introducing line is a line independent of the source-gas introducing line.

3. The apparatus of claim 1, wherein
   the replacement-gas introducing line comprises a bypass line communicated with the source-gas introducing line and having a replacement gas introduced thereinto, and
   the replacement gas is introduced from the bypass line into the reaction chamber through the source-gas introducing line.

4. The apparatus of claim 1, wherein the mass flow controller controls the introduction flow rate of the replacement gas and the discharge flow rate of the remaining source gas and the replacement gas to be an equal flow rate.

5. The apparatus of claim 2, wherein
   the mass flow controller comprises
   a first mass flow controller controlling the introduction flow rate of the replacement gas, and
   a second mass flow controller controlling the discharge flow rate of the remaining source gas and the replacement gas, and
   the first mass flow controller and the second mass flow controller control flow rates of gases flowing therethrough, respectively, to be an equal flow rate.

6. The apparatus of claim 1, wherein
   the source-gas introducing line comprises
   a group-III run line introducing a group-III source gas into the gas supplier, and
   a group-V run line introducing a group-V source gas into the gas supplier.

7. A film forming method using the apparatus of claim 1, comprising:
   placing the substrate in the reaction chamber;
   introducing a first source gas containing a component of a first film into the gas supplier facing the substrate and having the gas supply holes provided thereon through the source-gas introducing line communicated with the gas supplier, and supplying the first source gas into the reaction chamber from the gas supplier through the gas supply holes, to form the first film on the substrate;

stopping introduction of the first source gas and discharging the first source gas from the source-gas introducing line along with the vent gas through the vent line connected to the source-gas introducing line; and introducing the replacement gas into the gas supplier, discharging the replacement gas along with a first remaining source gas which is the first source gas remaining in the gas supplier from the gas supplier through the discharge line communicated with the gas supplier, and controlling one of the introduction flow rate of the replacement gas and the discharge flow rate of the first remaining source gas and the replacement gas to be the flow rate corresponding to the other flow rate by the mass flow controller.

8. A film forming method comprising:

placing a substrate in a reaction chamber;

introducing a first source gas containing a component of a first film into a gas supplier facing the substrate and having gas supply holes provided thereon through a source-gas introducing line communicated with the gas supplier, and supplying the first source gas into the reaction chamber from the gas supplier through the gas supply holes, to form the first film on the substrate;

stopping introduction of the first source gas and discharging the first source gas from the source-gas introducing line along with a vent gas through a vent line connected to the source-gas introducing line via a valve provided on the source-gas introducing line; and introducing a replacement gas into the gas supplier, discharging the replacement gas along with a first remaining source gas which is the first source gas remaining in the gas supplier from the gas supplier through a discharge line communicated with the gas supplier, and controlling one of an introduction flow rate of the replacement gas and a discharge flow rate of the first remaining source gas and the replacement gas to be a flow rate corresponding to the other flow rate by a mass flow controller, wherein the introducing the first source gas comprises causing the valve to be in a first state in which the valve opens a connection between the source-gas introducing line and the gas supplier and closes a connection between the source-gas introducing line and the vent line, and the stopping introduction of the first source gas comprises causing the valve to be in a second state in which the valve closes the connection between the source-gas introducing line and the gas supplier and opens the connection between the source-gas introducing line and the vent line to discharge the source gas from the source-gas introducing line along with the vent gas through the vent line.

9. The method of claim 8, further comprising discharging the replacement gas along with the first remaining source gas, then introducing a second source gas containing a component of a second film into the gas supplier through the source-gas introducing line, and supplying the second source gas from the gas supplier into the reaction chamber through the gas supply holes, to form the second film on the first film.

10. The method of claim 8, wherein the first source gas contains a group-III source gas and a group-V source gas.

11. The method of claim 9, wherein the second source gas contains a group-III source gas and a group-V source gas.

12. The apparatus of claim 1, wherein the vent line is not connected to the gas supplier.

13. The method of claim 8, wherein the vent line is not connected to the gas supplier.

* * * * *